(12) United States Patent
Shiragami

(10) Patent No.: US 12,172,925 B2
(45) Date of Patent: Dec. 24, 2024

(54) BONDED BODY MANUFACTURING METHOD AND BONDED BODY

(71) Applicant: Nippon Electric Glass Co., Ltd., Shiga (JP)

(72) Inventor: Toru Shiragami, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 90 days.

(21) Appl. No.: 17/909,819

(22) PCT Filed: Jan. 22, 2021

(86) PCT No.: PCT/JP2021/002228
§ 371 (c)(1),
(2) Date: Sep. 7, 2022

(87) PCT Pub. No.: WO2021/199613
PCT Pub. Date: Oct. 7, 2021

(65) Prior Publication Data
US 2024/0043323 A1    Feb. 8, 2024

(30) Foreign Application Priority Data

Mar. 31, 2020 (JP) ................................ 2020-064412
Jul. 30, 2020 (JP) ................................ 2020-129420

(51) Int. Cl.
*C03C 27/04* (2006.01)
*B23K 26/57* (2014.01)

(52) U.S. Cl.
CPC ............ *C03C 27/044* (2013.01); *B23K 26/57* (2015.10); *C03C 2203/52* (2013.01)

(58) Field of Classification Search
CPC .. B23K 26/324; B23K 26/57; B23K 2101/36; B23K 26/206; B23K 26/50; B23K 26/60;
(Continued)

(56) References Cited

U.S. PATENT DOCUMENTS

2001/0027633 A1    10/2001   Amako et al.
2019/0074234 A1    3/2019    Oka et al.
(Continued)

FOREIGN PATENT DOCUMENTS

CN    108886026        11/2018
JP    2001-326290      11/2001
(Continued)

OTHER PUBLICATIONS

International Search Report mailed on Apr. 6, 2021 in International (PCT) Application No. PCT/JP2021/002228.
(Continued)

*Primary Examiner* — Sonya M Sengupta
(74) *Attorney, Agent, or Firm* — WENDEROTH, LIND & PONACK, L.L.P.

(57) ABSTRACT

A method of manufacturing a bonded body includes a preparation step of interposing a sealing material containing glass between a highly thermal conductive substrate and a glass substrate, and a bonding step of forming a sealing layer by irradiating the sealing material with laser light. The bonding step includes a first heating step of preheating the sealing material at a temperature lower than a softening point of the sealing material or a temperature at which the sealing material is prevented from softening and flowing by irradiation with the laser light, and a second heating step of heating, after the first heating step, the sealing material at a temperature equal to or higher than the softening point of the sealing material or a temperature at which the sealing material softens and flows by irradiation with the laser light.

7 Claims, 8 Drawing Sheets

(58) Field of Classification Search
CPC ..... C03C 2203/52; C03C 27/044; C03C 3/14; C03C 8/04; C03C 8/08; C03C 8/14; C03C 8/24; C03C 27/042; H01L 23/02; H01L 23/10
See application file for complete search history.

(56) References Cited

U.S. PATENT DOCUMENTS

| | | | |
|---|---|---|---|
| 2019/0122945 A1 | 4/2019 | Shiragami et al. | |
| 2019/0296194 A1 | 9/2019 | Shiragami et al. | |
| 2021/0328109 A1 | 10/2021 | Shiragami | |
| 2024/0043323 A1* | 2/2024 | Shiragami | B23K 26/324 |

FOREIGN PATENT DOCUMENTS

| | | | |
|---|---|---|---|
| JP | 2013-21079 | 1/2013 | |
| JP | 2013-119501 | 6/2013 | |
| JP | 2013-239609 | 11/2013 | |
| JP | 2015-23263 | 2/2015 | |
| JP | 2017-212251 | 11/2017 | |
| KR | 10-0887368 | 3/2009 | |
| WO | WO-2004106221 A2 * | 12/2004 | ......... B81C 1/00269 |
| WO | 2017/212828 | 12/2017 | |
| WO | 2020/050031 | 3/2020 | |

OTHER PUBLICATIONS

First Office Action issued Mar. 26, 2024 in corresponding Chinese Patent Application No. 202180009456.2, with English-language Translation.

International Preliminary Report on Patentability and Written Opinion of the International Searching Authority issued Sep. 29, 2022, in International (PCT) Application No. PCT/JP2021/002228.

* cited by examiner

BONDED BODY MANUFACTURING METHOD AND BONDED BODY

TECHNICAL FIELD

The present invention relates to a method of manufacturing a bonded body by bonding a highly thermal conductive substrate and a glass substrate to each other, and to a bonded body.

BACKGROUND ART

As is well known, LED elements and other electronic elements are each housed in a hermetic package in order to prevent deterioration. The hermetic package is formed as, for example, a bonded body obtained by bonding a glass substrate to a base substrate.

As a method of bonding the base substrate and the glass substrate to each other, there has been known, for example, a method involving heating a sealing material containing glass powder by irradiation with laser light under a state in which the sealing material is interposed between the base substrate and the glass substrate (see, for example, Patent Literature 1). The sealing material softens and flows by heating with laser light, and the base substrate (container) and the glass substrate (glass cover) adhere to each other. When the sealing material that has softened and flowed is firmly fixed by cooling, a sealing layer is formed, and the base substrate and the glass substrate are hermetically bonded to each other. As described above, a hermetic package can be obtained without applying a thermal load to the element by irradiating the sealing material with laser light (laser sealing).

CITATION LIST

Patent Literature 1: JP 2017-212251 A

SUMMARY OF INVENTION

Technical Problem

The base substrate may be formed of a material having high thermal conductivity (hereinafter referred to as "highly thermal conductive substrate") in order to prevent the deterioration of the element by heat generation. When the highly thermal conductive substrate and the glass substrate are bonded to each other via the sealing material, there is a risk in that the sealing material and the glass substrate having been heated may be rapidly cooled due to the rapid progress of heat conduction from the sealing material to the highly thermal conductive substrate. In particular, in the case of laser sealing, unlike a sealing method using a general firing furnace, only the sealing material and the periphery thereof are locally heated, and hence the above-mentioned risk is increased. When the sealing material and the glass substrate are rapidly cooled, cracks occur at the interface between the sealing layer and the glass substrate, in the sealing layer itself, and in the glass substrate itself, which causes bonding failure. Herein, the "highly thermal conductive substrate" refers to a substrate having a thermal conductivity of 10 W/m·K or more at 20° C.

The present invention has been made in view of the above-mentioned circumstances, and a technical object of the present invention is to reduce the occurrence of bonding failure between a highly thermal conductive substrate and a glass substrate.

Solution to Problem

In order to achieve the above-mentioned object, according to one embodiment of the present invention, there is provided a method of manufacturing a bonded body comprising a highly thermal conductive substrate, a glass substrate, and a sealing layer configured to bond the highly thermal conductive substrate and the glass substrate to each other, the method comprising: a preparation step of interposing a sealing material containing glass between the highly thermal conductive substrate and the glass substrate; and a bonding step of forming the sealing layer by irradiating the sealing material with laser light, wherein the bonding step comprises: a first heating step of preheating the sealing material at a temperature lower than a softening point of the sealing material by irradiation with the laser light; and a second heating step of heating, after the first heating step, the sealing material at a temperature equal to or higher than the softening point of the sealing material by irradiation with the laser light.

According to this configuration, when the sealing material is preheated at a temperature lower than the softening point thereof by irradiation with the laser light in the first heating step of the bonding step, the highly thermal conductive substrate can be heated via the sealing material. When the sealing material is heated at a temperature equal to or higher than the softening point thereof by irradiation with the laser light in the second heating step after the first heating step, the sealing layer with which the highly thermal conductive substrate and the glass substrate are hermetically bonded to each other can be formed while the rapid cooling of the sealing material and the glass substrate due to heat conduction from the sealing material to the highly thermal conductive substrate is reduced. As a result, the occurrence of bonding failure between the highly thermal conductive substrate and the glass substrate can be reduced.

In order to achieve the above-mentioned object, according to one embodiment of the present invention, there is also provided a method of manufacturing a bonded body comprising a highly thermal conductive substrate, a glass substrate, and a sealing layer configured to bond the highly thermal conductive substrate and the glass substrate to each other, the method comprising: a preparation step of interposing a sealing material containing glass between the highly thermal conductive substrate and the glass substrate; and a bonding step of forming the sealing layer by irradiating the sealing material with laser light, wherein the bonding step comprises: a first heating step of preheating the sealing material at a temperature at which the sealing material is prevented from softening and flowing by irradiation with the laser light; and a second heating step of heating, after the first heating step, the sealing material at a temperature at which the sealing material softens and flows by irradiation with the laser light.

According to this configuration, when the sealing material is preheated at a temperature at which the sealing material is prevented from softening and flowing by irradiation with the laser light in the first heating step of the bonding step, the highly thermal conductive substrate can be heated via the sealing material. When the sealing material is heated at a temperature at which the sealing material softens and flows by irradiation with the laser light in the second heating step after the first heating step, the sealing layer with which the highly thermal conductive substrate and the glass substrate are hermetically bonded to each other can be formed while the rapid cooling of the sealing material and the glass substrate due to heat conduction from the sealing material to the highly thermal conductive substrate is reduced. As a result, the occurrence of bonding failure between the highly thermal conductive substrate and the glass substrate can be reduced.

In order to achieve the above-mentioned object, according to one embodiment of the present invention, there is also provided a method of manufacturing a bonded body comprising a highly thermal conductive substrate, a glass substrate, and a sealing layer configured to bond the highly thermal conductive substrate and the glass substrate to each other, the method comprising: a preparation step of interposing a sealing material containing glass between the highly thermal conductive substrate and the glass substrate; and a bonding step of forming the sealing layer by irradiating the sealing material with laser light, wherein the bonding step comprises: a first heating step of preheating the sealing material by irradiation with the laser light; and a second heating step of heating, after the first heating step, the sealing material by irradiation with the laser light, and wherein an output of the laser light in the first heating step is smaller than an output of the laser light in the second heating step.

According to this configuration, the sealing material can be preheated at an output at which the sealing material is prevented from softening and flowing by irradiation with the laser light in the first heating step of the bonding step, and thus the highly thermal conductive substrate can be heated via the sealing material. The sealing material can be heated at an output at which the sealing material softens and flows by irradiation with the laser light in the second heating step after the first heating step, and thus the sealing layer with which the highly thermal conductive substrate and the glass substrate are hermetically bonded to each other can be formed while the rapid cooling of the sealing material and the glass substrate due to heat conduction from the sealing material to the highly thermal conductive substrate is reduced. As a result, the occurrence of bonding failure between the highly thermal conductive substrate and the glass substrate can be reduced.

In the preparation step, the sealing material may be formed into a closed curve shape, and in the first heating step, the laser light may be scanned so as to orbit a plurality of times along a circumferential direction of the sealing material. As a result, in the first heating step, the entire sealing material formed into a closed curve shape can be evenly heated, and the highly thermal conductive substrate can be sufficiently heated via the sealing material.

In the second heating step, the laser light having an output larger than the output of the laser light in the first heating step may be radiated to the sealing material. As a result, the transition from the first heating step to the second heating step can be efficiently performed.

In the method according to each of the above-mentioned embodiments of the present invention, the highly thermal conductive substrate may be a silicon substrate.

In the method according to each of the above-mentioned embodiments of the present invention, the laser light may be a semiconductor laser.

In the method according to each of the above-mentioned embodiments of the present invention, the bonded body may further comprise an element between the highly thermal conductive substrate and the glass substrate. As a result, the bonded body (hermetic package) excellent in heat dissipating property and hermeticity can be manufactured.

The method according to each of the above-mentioned embodiments of the present invention may further comprise, before the preparation step, a step of forming a silicon oxide film ($SiO_2$) or a silicon nitride film ($Si_3N_4$) on a surface of the highly thermal conductive substrate, to thereby interpose the silicon oxide film or the silicon nitride film between the highly thermal conductive substrate and the sealing layer.

In order to achieve the above-mentioned object, according to one embodiment of the present invention, there is also provided a bonded body, comprising a highly thermal conductive substrate and a glass substrate sealed to each other via a sealing material.

In the bonded body according to the one embodiment of the present invention, the highly thermal conductive substrate may be a silicon substrate.

In the bonded body according to the one embodiment of the present invention, the sealing material may be a composite material containing glass powder and refractory filler powder.

In order to achieve the above-mentioned object, according to one embodiment of the present invention, there is provided a bonded body, comprising: a highly thermal conductive substrate; a glass substrate; and a sealing layer configured to bond the highly thermal conductive substrate and the glass substrate to each other, wherein the highly thermal conductive substrate comprises a recess and a bonding surface to be bonded to the glass substrate via the sealing layer, and wherein a ratio (W1/W) of a width (W1) of the sealing layer to a width (W) of the bonding surface is from 0.05 to 1.

Through definition of the relationship between the width of the sealing layer and the width of the bonding surface of the highly thermal conductive substrate as described above, when the sealing layer is heated in order to bond the highly thermal conductive substrate and the glass substrate to each other, cracks ascribed to the thermal shock caused by the rapid cooling of the sealing layer and the glass substrate due to heat conduction from the sealing layer to the highly thermal conductive substrate are less liable to occur. As a result, the sealing layer with which the highly thermal conductive substrate and the glass substrate are hermetically bonded to each other can be formed, and the occurrence of bonding failure can be reduced.

In order to achieve the above-mentioned object, according to one embodiment of the present invention, there is provided a bonded body, comprising: a highly thermal conductive substrate; a glass substrate; and a sealing layer configured to bond the highly thermal conductive substrate and the glass substrate to each other, wherein the highly thermal conductive substrate comprises a recess and a bonding surface to be bonded to the glass substrate via the sealing layer, and wherein a ratio (A1/A2) of an area (A1) of the sealing layer that is brought into contact with the bonding surface to an area (A2) of the bonding surface is from 0.05 to 1.

Through definition of the relationship between the area of the sealing layer that is brought into contact with the bonding surface of the highly thermal conductive substrate and the area of the bonding surface as described above, when the sealing layer is heated in order to bond the highly thermal conductive substrate and the glass substrate to each other, cracks ascribed to the thermal shock caused by the rapid cooling of the sealing layer and the glass substrate due to heat conduction from the sealing layer to the highly thermal conductive substrate are less liable to occur. As a result, the sealing layer with which the highly thermal conductive substrate and the glass substrate are hermetically bonded to each other can be formed, and the occurrence of bonding failure can be reduced.

A silicon oxide film (SiO$_2$) or a silicon nitride film (Si$_3$N$_4$) may be formed on the surface of the highly thermal conductive substrate, to thereby interpose the silicon oxide film or the silicon nitride film between the highly thermal conductive substrate and the sealing layer. As a result, the wettability of the sealing material to the highly thermal conductive substrate is improved, damage and peeling of the sealing layer ascribed to the thermal shock are easily avoided, and the occurrence of bonding failure can be further reduced.

Advantageous Effects of Invention

According to the present invention, the occurrence of bonding failure between the highly thermal conductive substrate and the glass substrate can be reduced.

DESCRIPTION OF EMBODIMENTS

Now, embodiments of the present invention are described with reference to the drawings. In FIG. 1 to FIG. 8, a bonded body and a method of manufacturing the same according to one embodiment of the present invention are illustrated.

Figure 1:
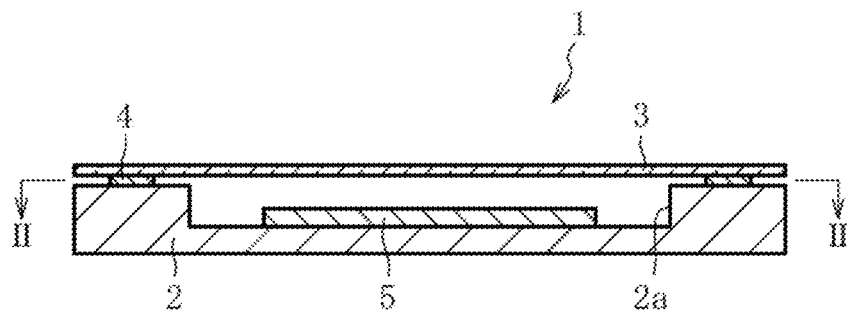
FIG. 1 is a sectional view for illustrating a bonded body manufactured by the present invention.
Figure 2:
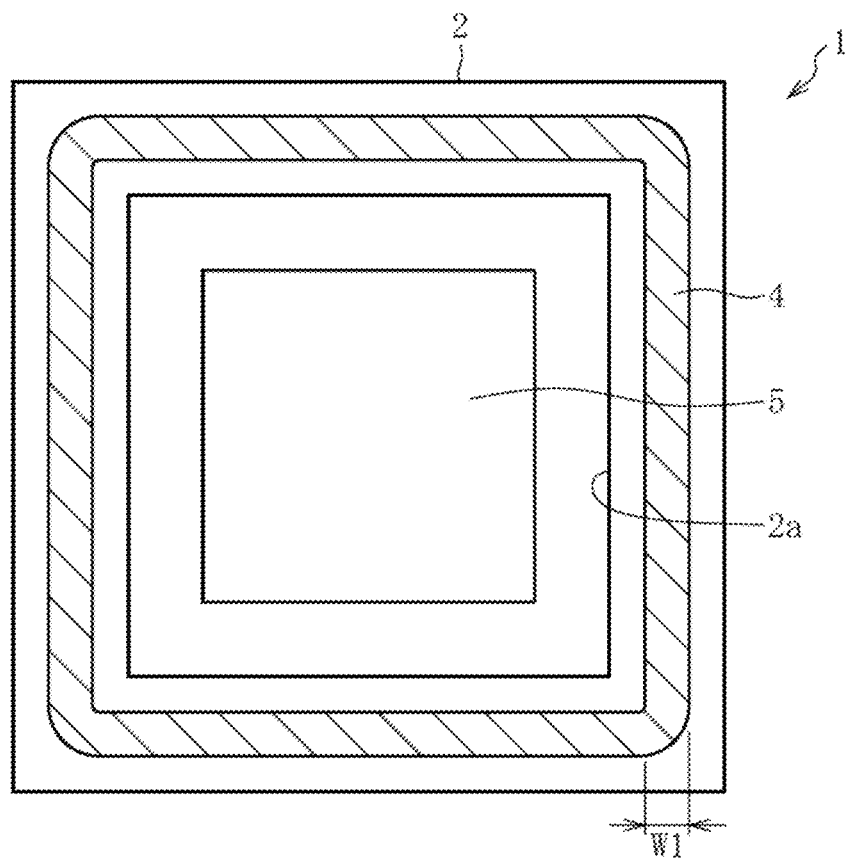
FIG. 2 is a sectional view seen from the direction of the arrow II-II of FIG. 1.

In FIG. 1 and FIG. 2, a hermetic package is illustrated as an example of a bonded body manufactured by the present invention. A bonded body 1 comprises a highly thermal conductive substrate 2 serving as a base material, a glass substrate 3 superposed on the highly thermal conductive substrate 2, a sealing layer 4 for bonding the highly thermal conductive substrate 2 and the glass substrate 3 to each other, and an element 5 housed between the highly thermal conductive substrate 2 and the glass substrate 3.

The highly thermal conductive substrate 2 comprises a recess 2a capable of housing the element 5. The highly thermal conductive substrate 2 is formed of, for example, a silicon substrate, but is not limited to this configuration. The highly thermal conductive substrate 2 may be formed of any of other metal substrates, ceramic substrates, semiconductor substrates, and other various substrates. The thickness of the highly thermal conductive substrate 2 is in a range of from 0.1 mm to 5.0 mm, but is not limited to this range.

A silicon oxide film (SiO$_2$) or a silicon nitride film (Si$_3$N$_4$) may be formed on the surface of the highly thermal conductive substrate 2, to thereby interpose the silicon oxide film or the silicon nitride film between the highly thermal conductive substrate and the sealing layer. When the highly thermal conductive substrate 2 is formed of a silicon substrate, a metal substrate, or a semiconductor substrate, there is a risk in that the wettability of a sealing material 6 to the highly thermal conductive substrate 2 may be insufficient. In view of the foregoing, the wettability of the sealing material 6 to the highly thermal conductive substrate 2 can be improved by interposing the silicon oxide film or the silicon nitride film between the sealing material 6 and the highly thermal conductive substrate 2. As a result, peeling and damage of the sealing layer 4 ascribed to a thermal shock are easily avoided. The thickness of the silicon oxide film, the silicon nitride film, or the like to be formed on the surface of the highly thermal conductive substrate 2 is preferably 5.0 μm or less, more preferably 3.0 μm or less, still more preferably 2.0 μm or less, particularly preferably 1.0 μm or less, and the lower limit thereof is 5 nm. For film formation of the silicon oxide film, the silicon nitride film, or the like, a sputtering method, a vacuum vapor deposition method, a vacuum vapor deposition method using ion assisted deposition or ion plating, a CVD method, or the like is used.

The thermal conductivity of the highly thermal conductive substrate 2 is higher than the thermal conductivity of the glass substrate 3. The thermal conductivity of the highly thermal conductive substrate 2 at 20° C. is preferably from 10 W/m·K to 500 W/m·K, more preferably from 30 W/m·K to 300 W/m·K, still more preferably from 70 W/m·K to 250 W/m·K, particularly preferably from 100 W/m·K to 200 W/m·K, but is not limited to these ranges.

The glass substrate 3 is formed into a rectangular shape, but is not limited to this shape. As glass forming the glass substrate 3, for example, alkali-free glass, borosilicate glass, soda-lime glass, or the like may be used. The thickness of the glass substrate 3 is not particularly limited, but for example, a substrate having a thickness in a range of from 0.01 mm to 2.0 mm is used. The thermal conductivity of the glass substrate 3 at 20° C. is preferably from 0.5 W/m·K to 5 W/m·K, but is not limited to this range.

The sealing layer 4 is formed by interposing the sealing material 6 between the highly thermal conductive substrate 2 and the glass substrate 3, and irradiating the sealing material 6 with laser light, to thereby cause the sealing material 6 to soften and flow by heating.

Various materials may be used as the sealing material. Of those, from the viewpoint of increasing sealing strength, a composite material (glass frit) containing bismuth-based glass powder and refractory filler powder is preferably used. As the composite material, a composite material containing 55 vol % to 100 vol % of bismuth-based glass powder and 0 vol % to 45 vol % of refractory filler powder is preferably used. A composite material containing 60 vol % to 95 vol % of bismuth-based glass powder and 5 vol % to 40 vol % of refractory filler powder is more preferably used. A composite material containing 60 vol % to 85 vol % of bismuth-based glass powder and 15 vol % to 40 vol % of refractory filler powder is particularly preferably used.

When the refractory filler powder is added, the thermal expansion coefficient of the sealing layer 4 is easily matched with the thermal expansion coefficients of the highly thermal conductive substrate 2 and the glass substrate 3. As a result, it becomes easy to reduce the situation in which an unreasonable stress remains in a region of the sealing layer 4 after the highly thermal conductive substrate 2 and the glass substrate 3 are bonded to each other. Meanwhile, when the content of the refractory filler powder is too large, the content of the bismuth-based glass powder becomes relatively small. Because of this, the surface smoothness of the sealing material 6 before laser sealing is lowered, and sealing accuracy is liable to be reduced.

The bismuth-based glass preferably comprises as a glass composition, in terms of mol %, 28% to 60% of $Bi_2O_3$, 15% to 37% of $B_2O_3$, 0% to 30% of ZnO, and 1% to 40% of CuO+MnO (total amount of CuO and MnO). The reasons why the content range of each component is limited as described above are described below. In the description of the glass composition range, the expression "%" means "mol %".

$Bi_2O_3$ is a main component for reducing the softening point of the glass. The content of $Bi_2O_3$ is preferably from 28% to 60% or from 33% to 55%, particularly preferably from 35% to 45%. When the content of $Bi_2O_3$ is too small, the softening point becomes too high, and the softening flowability of the glass is liable to be reduced. Meanwhile, when the content of $Bi_2O_3$ is too large, the glass is liable to devitrify at the time of sealing, and owing to the devitrification, the softening flowability is liable to be reduced.

$B_2O_3$ is an essential component as a glass-forming component. The content of $B_2O_3$ is preferably from 15% to 37% or from 19% to 33%, particularly preferably from 22% to 30%. When the content of $B_2O_3$ is too small, a glass network is hardly formed, and hence the glass is liable to devitrify. Meanwhile, when the content of $B_2O_3$ is too large, the glass has increased viscosity, and hence the softening flowability is liable to be reduced.

ZnO is a component which improves the devitrification resistance of the glass. The content of ZnO is preferably from 0% to 30%, from 3% to 25%, or from 5% to 22%, particularly preferably from 5% to 20%. When the content of ZnO is too large, the glass composition loses its component balance, and hence the devitrification resistance is liable to be reduced contrarily.

CuO and MnO are each a component which significantly improves the laser absorption ability of the glass. The total content of CuO and MnO is preferably from 1% to 40%, from 3% to 35%, or from 10% to 30%, particularly preferably from 15% to 30%. When the total content of CuO and MnO is too small, the laser absorption ability is liable to be reduced. Meanwhile, when the total content of CuO and MnO is too large, the softening point is excessively increased, and the glass hardly softens and flows even when irradiated with laser light. In addition, the glass becomes thermally unstable, and the glass is liable to devitrify. The content of CuO is preferably from 1% to 30%, particularly preferably from 10% to 25%. The content of MnO is preferably from 0% to 25% or from 1% to 25%, particularly preferably from 3% to 15%.

In addition, glass powder of silver phosphoric acid-based glass, tellurium-based glass, or the like as well as the bismuth-based glass may be used as the sealing material. The silver phosphoric acid-based glass and the tellurium-based glass each easily soften and flow at low temperature as compared to the bismuth-based glass, and can each reduce heat strain occurring after heating with laser light. Further, when mixed with the refractory filler powder, the silver phosphoric acid-based glass and the tellurium-based glass can each increase the mechanical strength of the sealing layer 4, and can each reduce the thermal expansion coefficient of the sealing layer 4, as with the bismuth-based glass.

The silver phosphoric acid-based glass preferably comprises as a glass composition, in terms of mol %, 10% to 50% of $Ag_2O$, 10% to 35% of $P_2O_5$, 3% to 25% of ZnO, and 0% to 30% of a transition metal oxide.

The tellurium-based glass preferably comprises as a glass composition, in terms of mol %, 30% to 80% of $TeO_2$, 5% to 50% of $MoO_3$, 0% to 15% of $P_2O_5$, and 0% to 40% of a transition metal oxide (provided that $MoO_3$ is excluded).

Various materials may be used as the refractory filler powder. Of those, the refractory filler powder is preferably formed of one kind or two or more kinds of materials selected from cordierite, zircon, tin oxide, niobium oxide, zirconium phosphate-based ceramic, willemite, β-eucryptite, and β-quartz solid solution.

The average particle diameter $D_{50}$ of the refractory filler powder is preferably less than 2 μm, particularly preferably 0.1 μm or more and less than 1.5 μm. When the average particle diameter $D_{50}$ of the refractory filler powder is too large, the surface smoothness of the sealing layer 4 is liable to be reduced. Besides, the average thickness of the sealing layer 4 is liable to be increased, with the result that the sealing accuracy is liable to be reduced. Herein, the average particle diameter $D_{50}$ refers to a value measured by laser diffractometry, and means a particle diameter at which an integrated amount is accumulated to be 50% from a smaller particle side in a volume-based cumulative particle size distribution curve measured by laser diffractometry.

The 99% particle diameter $D_{99}$ of the refractory filler powder is preferably less than 5 μm or 4 μm or less, particularly preferably 0.3 μm or more and 3 μm or less. When the 99% particle diameter $D_{99}$ of the refractory filler powder is too large, the surface smoothness of the sealing layer 4 is liable to be reduced. Besides, the average thickness of the sealing layer 4 is liable to be increased, with the result that the laser sealing accuracy is liable to be reduced. Herein, the 99% particle diameter $D_{99}$ refers to a value measured by laser diffractometry, and means a particle diameter at which an integrated amount is accumulated to be 99% from a smaller particle side in a volume-based cumulative particle size distribution curve measured by laser diffractometry.

The softening point of the sealing material is preferably 300° C. or more and 550° C. or less. The softening point of the sealing material 6 corresponds to the fourth inflection point measured with a macro-type DTA apparatus.

As illustrated in FIG. 2, the sealing layer 4 is formed into a closed curve shape so as to seal a space for housing the element 5. In the present invention, the term "closed curve" encompasses not only a shape formed only of a curve, but also a shape formed of a combination of a curve and a straight line and a shape formed only of a straight line (for example, a quadrangular shape or other polygonal shapes).

The thickness of the sealing layer 4 is preferably from 1 μm to 20 μm, more preferably from 3 μm to 8 μm. The width dimension W1 of the sealing layer 4 is preferably from 50 μm to 2,000 μm, more preferably from 100 μm to 1,000 μm.

The element 5 is arranged in a space (cavity) defined by the recess 2a of the highly thermal conductive substrate 2, the glass substrate 3, and the sealing layer 4. As the element 5, various elements, for example, a light emitting element such as a deep ultraviolet light emitting diode (LED), a micro electro mechanical systems (MEMS) element, and a charge coupled device (CCD) element may each be used.

Now, a method of manufacturing the bonded body 1 having the above-mentioned configuration is described with reference to FIG. 3 to FIG. 8. This method comprises a preparation step of superposing the highly thermal conductive substrate 2 and the glass substrate 3 on each other to form a laminate, and a bonding step of bonding, after the preparation step, the glass substrate 3 and the highly thermal conductive substrate 2 to each other by heating the sealing material 6.

The preparation step comprises a fixing step of fixing the sealing material 6 to the surface of the glass substrate 3 and a lamination step of laminating, after the fixing step, the glass substrate 3 on the highly thermal conductive substrate 2.

The fixing step comprises a step (application step) of applying the sealing material 6 to the surface of the glass substrate 3 and a step (heating step) of heating, after the application step, the sealing material 6.

Figure 3:
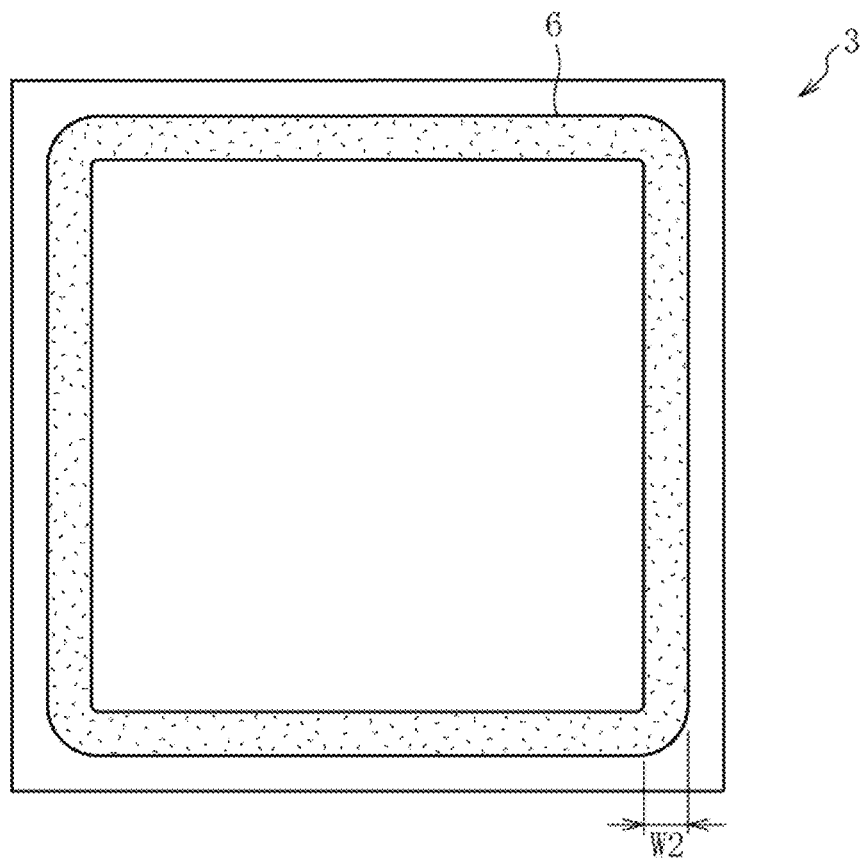
FIG. 3 is a plan view of a glass substrate for illustrating a preparation step in a method of manufacturing a bonded body.

As illustrated in FIG. 3, in the application step, the sealing material 6 in a paste form is applied to the surface of the glass substrate 3 so as to form, for example, a closed curve having a quadrangular shape, for example, by screen printing, with a dispenser, or the like. The sealing material is generally formed into a paste form by kneading the above-mentioned composite material and a vehicle with a triple roller or the like. The vehicle generally contains an organic resin and a solvent. The organic resin is added for the purpose of adjusting the viscosity of the paste.

In the heating step, the sealing material 6 applied to the glass substrate 3 is heated to a temperature equal to or higher than a softening temperature with an electric furnace or the like. Through this heating step, the organic resin is decomposed, and the glass powder contained in the sealing material 6 is caused to soften and flow. As a result, the sealing material 6 can be firmly fixed to the glass substrate 3.

In the heating step related to the preparation step, the sealing material 6 may be heated (fired) with laser light without using an electric furnace or the like.

Figure 4:
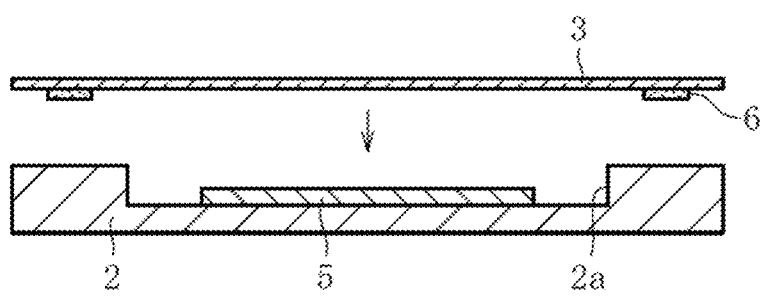
FIG. 4 is a sectional view of a laminate for illustrating a lamination step in the method of manufacturing a bonded body.

As illustrated in FIG. 4, in the lamination step, the glass substrate 3 is superposed on the surface of the highly thermal conductive substrate 2 under a state in which the surface of the glass substrate 3 to which the sealing material 6 is fixed faces the highly thermal conductive substrate 2. The glass substrate 3 is laminated on the highly thermal conductive substrate 2 so that the recess 2a of the highly thermal conductive substrate 2 is positioned on an inner side of the closed curve shape of the sealing material 6. The element 5 is installed in a bottom portion of the recess 2a in the highly thermal conductive substrate 2 before the lamination step.

Figure 5:
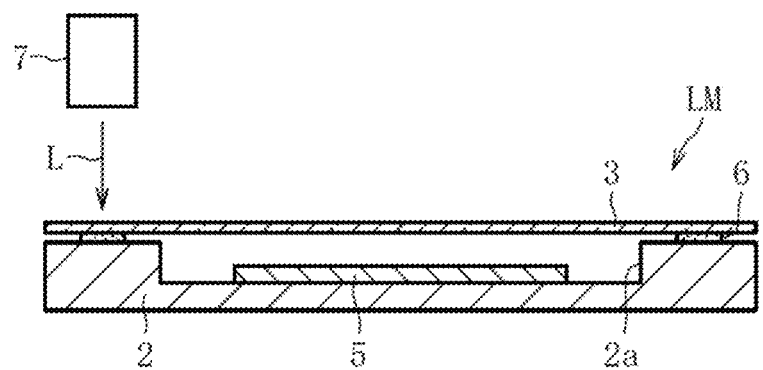
FIG. 5 is a sectional view of the laminate for illustrating a bonding step in the method of manufacturing a bonded body.

As illustrated in FIG. 5, through the lamination step, a laminate LM in which the sealing material 6 is interposed between the highly thermal conductive substrate 2 and the glass substrate 3 is formed.

The bonding step comprises a first heating step of preheating the sealing material 6 at a temperature lower than the softening point of the sealing material 6 or a temperature at which the sealing material 6 is prevented from softening and flowing by irradiation with laser light L, and a second heating step of heating, after the first heating step, the sealing material 6 at a temperature equal to or higher than the softening point of the sealing material 6 or a temperature at which the sealing material 6 softens and flows by irradiation with the laser light L.

As illustrated in FIG. 5, in each of the heating steps, the laser light L is radiated to the sealing material 6 of the laminate LM from the glass substrate 3 side with a laser irradiation device 7. The wavelength of the laser light L is preferably from 600 nm to 1,600 nm. As the laser to be used, a semiconductor laser is suitably used, but the laser is not limited thereto. Various lasers, such as a YAG laser, a green laser, and an ultrashort pulse laser, may be used.

Figure 6:
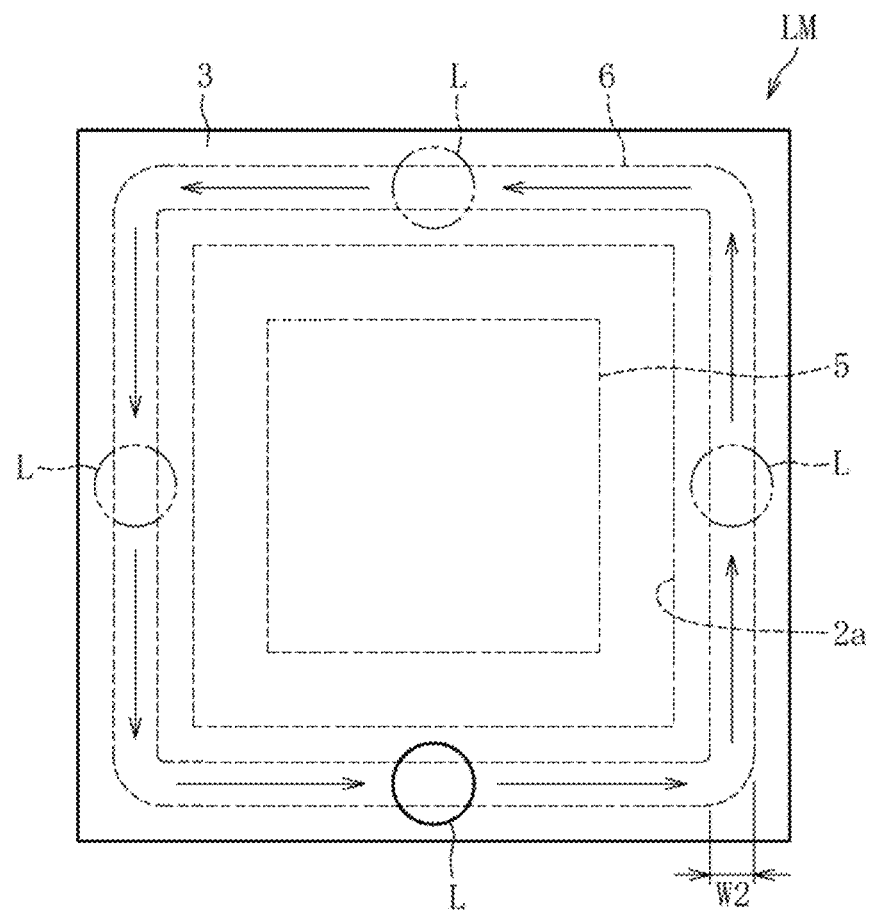
FIG. 6 is a plan view of the laminate for illustrating the bonding step in the method of manufacturing a bonded body.

As illustrated in FIG. 6, in the first heating step, the laser light L is scanned so as to orbit along the circumferential direction of the closed curve shape of the sealing material 6. The number of laps of the laser light L in the first heating step is preferably from 2 to 500. The output of the laser light L in the first heating step is preferably from 1 W to 25 W, more preferably from 2 W to 20 W, still more preferably from 5 W to 18 W, but is not limited to these ranges. It is desired that the spot diameter of the laser light L be set to be larger than a width dimension W2 of the sealing material 6. The heating temperature of the sealing material 6 in the first heating step is preferably a temperature lower than the softening point of the sealing material 6 or a temperature at which the sealing material 6 is prevented from softening and flowing, for example, from 380° C. to 480° C. when the bismuth-based glass powder is used for the sealing material 6.

In the second heating step, the laser light L is radiated to the sealing material 6 at an output (hereinafter referred to as "second output") larger than the output in the first heating step (hereinafter referred to as "first output"). The second output of the laser light L in the second heating step is preferably from 15 W to 50 W, more preferably from 18 W to 40 W, still more preferably from 20 W to 35 W, but is not limited to these ranges. In the second heating step, the laser light L is continuously radiated to the sealing material 6 without stopping the laser light L radiated to the sealing material 6 in the first heating step.

In the second heating step, the laser light L is scanned so as to orbit once or a plurality of times along the circumferential direction of the closed curve shape of the sealing material 6. The number of laps of the laser light L in the second heating step is set to be smaller than the number of laps of the laser light L in the first heating step, but is not limited thereto. The number of laps of the laser light L in the second heating step may be equal to or larger than the number of laps of the laser light L in the first heating step. The spot diameter of the laser light L is set to be the same as the spot diameter of the laser light L in the first heating step, but may be different from the spot diameter in the first heating step.

In the bonding step according to this embodiment, the scanning speed of the laser light L in the first heating step is equal to the scanning speed of the laser light L in the second heating step, but is not limited thereto. The scanning speed of the laser light L in the first heating step may be different from the scanning speed in the second heating step.

Figure 7:
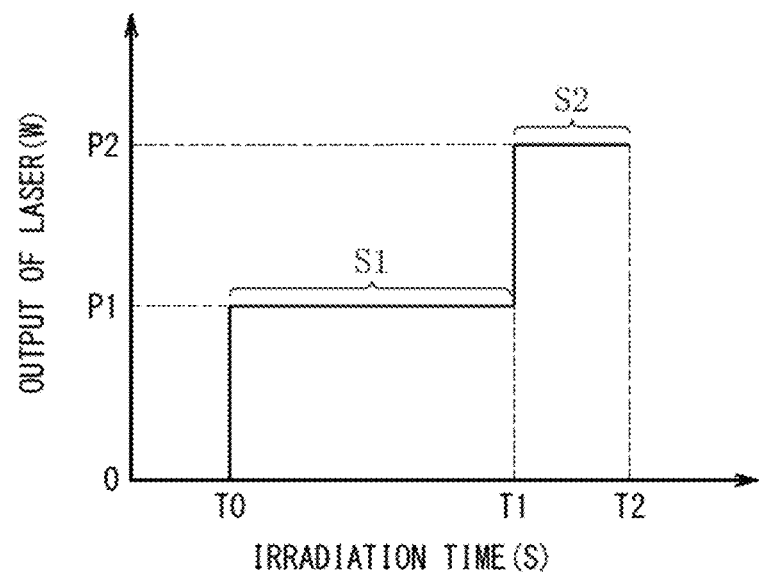
FIG. 7 is a graph showing a relationship between the output of laser light and the irradiation time thereof in the bonding step.
Figure 8:
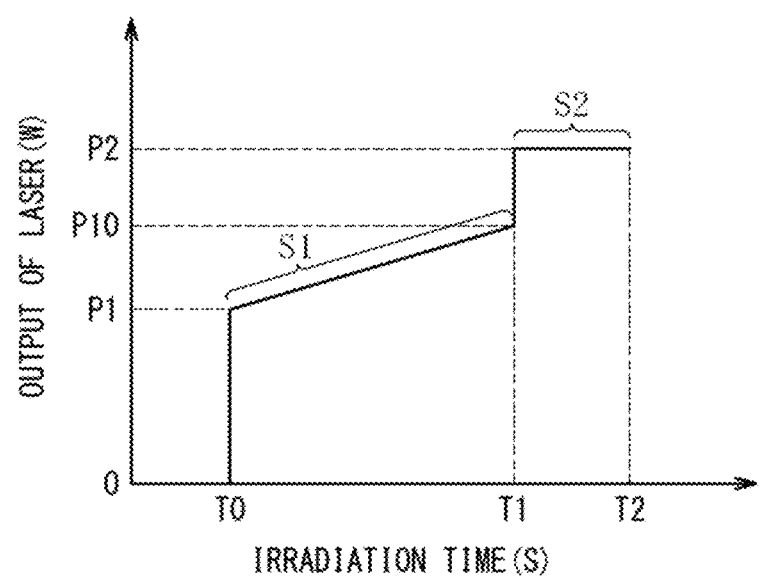
FIG. 8 is a graph showing a relationship between the output of laser light and the irradiation time thereof in the bonding step.

FIG. 7 and FIG. 8 are each a graph showing a relationship between the irradiation time of the laser light (heating time) and the output of the laser light in the bonding step.

As shown in FIG. 7, a first heating step S1 is performed for a period between time T0 and time T1. During this period, the laser light is radiated to the sealing material 6 while a first output P1 is maintained constant. A second heating step S2 is performed for a period between the time T1 and the time T2. During this period, the laser light is radiated to the sealing material 6 while a second output P2 larger than the first output P1 is maintained constant.

The first output P1 may not be maintained constant as shown in FIG. 7. That is, as shown in FIG. 8, in the first heating step S1, the first output P1 of the laser light at the start time T0 may be gradually increased to an intermediate output P10 in the period of from the time T0 to the time T1. The intermediate output P10 is larger than the first output P1 and smaller than the second output P2.

The heating temperature of the sealing material 6 in the second heating step is preferably a temperature equal to or higher than the softening point thereof, for example, from 500° C. to 750° C. when the bismuth-based glass powder is used for the sealing material 6. When the sealing material 6 is heated with the laser light L in the second heating step, a glass component thereof softens and flows and is fused to the highly thermal conductive substrate 2. When the irradiation of the laser light L is finished, and the sealing material 6 is firmly fixed in the process of being cooled, the sealing layer 4 having a closed curve shape with which the highly thermal conductive substrate 2 and the glass substrate 3 are bonded to each other, and in which the element 5 is hermetically sealed is formed.

According to the method of manufacturing the bonded body 1 according to this embodiment described above, in the first heating step of the bonding step, the sealing material 6 is preheated at a temperature lower than the softening point thereof or a temperature at which the sealing material 6 is prevented from softening and flowing by irradiation with the laser light L. Thus, the highly thermal conductive substrate 2 can be heated via the sealing material 6. In the second heating step after the first heating step, the sealing material 6 is heated at a temperature equal to or higher than the softening point or a temperature at which the sealing material 6 softens and flows by irradiation with the laser light L. Thus, the sealing layer 4 with which the highly thermal conductive substrate 2 and the glass substrate 3 are hermetically bonded to each other can be formed while the rapid cooling of the sealing material 6 and the glass substrate 3 due to heat conduction from the sealing material 6 to the highly thermal conductive substrate 2 is reduced. As a result, the occurrence of bonding failure between the highly thermal conductive substrate 2 and the glass substrate 3 can be reduced.

Figure 9:
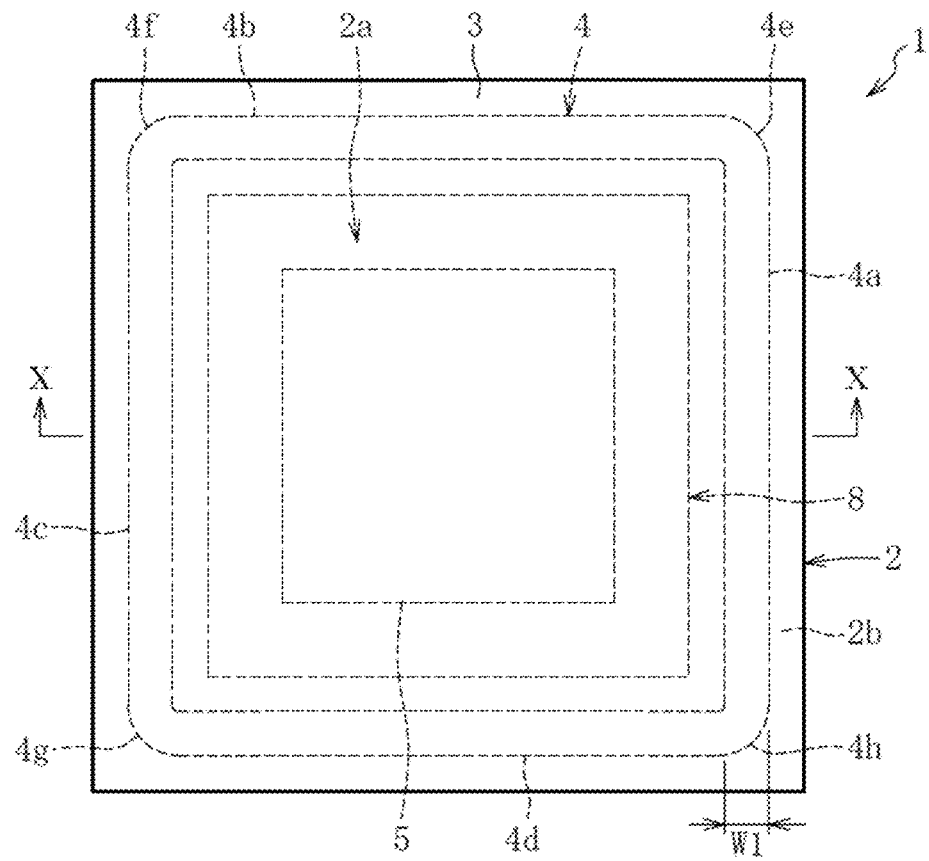
FIG. 9 is a plan view of a bonded body according to another embodiment.
Figure 10:
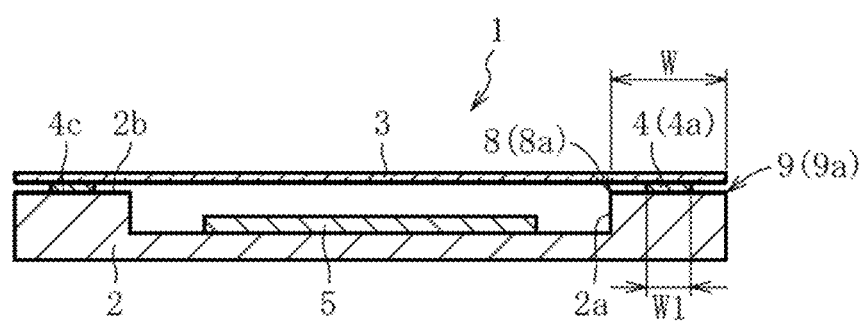
FIG. 10 is a sectional view seen from the direction of the arrow X-X of FIG. 9.

In each of FIG. 9 to FIG. 12, there is illustrated another embodiment of the present invention. As illustrated in FIG. 9 and FIG. 10, the bonded body 1 comprises the highly thermal conductive substrate 2 serving as a base material, the glass substrate 3 superposed on the highly thermal conductive substrate 2, the sealing layer 4 for bonding the highly thermal conductive substrate 2 and the glass substrate 3 to each other, and the element 5 housed between the highly thermal conductive substrate 2 and the glass substrate 3 in the same manner as in the above-mentioned embodiment of FIG. 1 to FIG. 8.

The highly thermal conductive substrate 2 comprises the recess 2a for housing the element 5 and a surface (hereinafter referred to as "bonding surface") 2b to which the glass substrate 3 is bonded. The bonding surface 2b is formed into a quadrangular frame shape so as to surround the periphery of the recess 2a, but the shape of the bonding surface 2b is not limited to this embodiment.

The bonding surface 2b comprises an inner edge portion 8 and an outer edge portion 9. The bonding surface 2b is a surface surrounded by the inner edge portion 8 and the outer edge portion 9.

Figure 11:
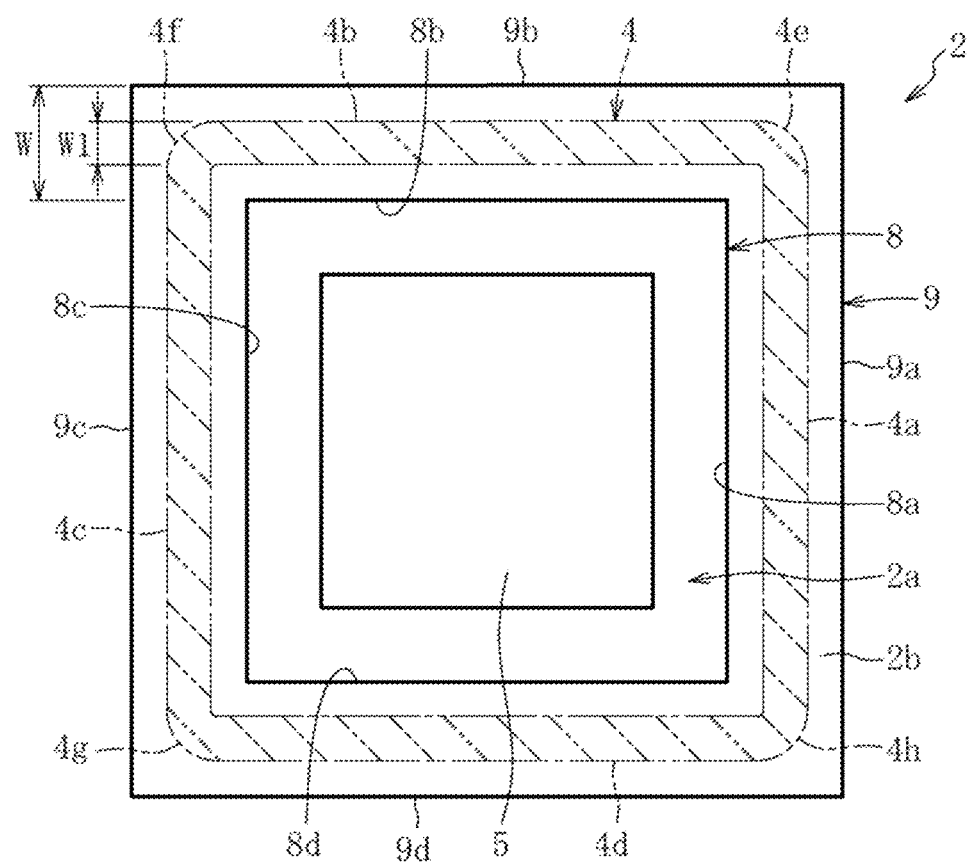
FIG. 11 is a plan view of a highly thermal conductive substrate.
Figure 12:
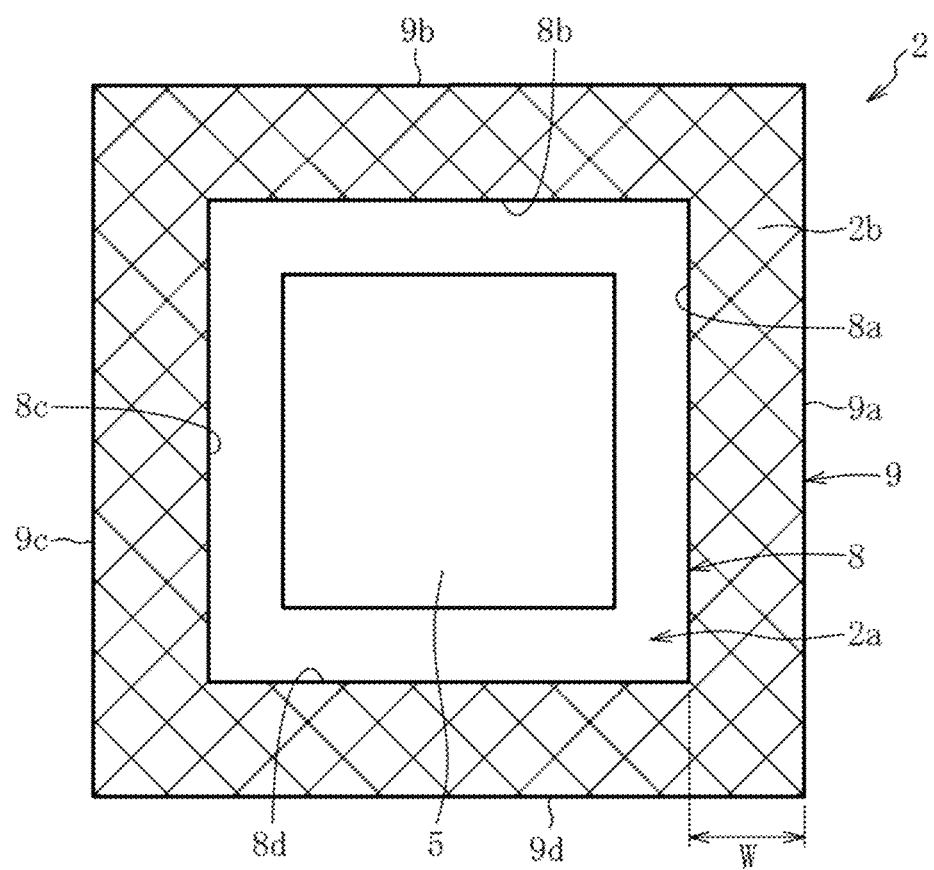
FIG. 12 is a plan view of the highly thermal conductive substrate.

As illustrated in FIG. 11 and FIG. 12, the inner edge portion 8 is a portion serving as a boundary between the recess 2a and the bonding surface 2b. The inner edge portion 8 comprises four straight line portions 8a to 8d, but the number of the straight line portions 8a to 8d is not limited to this embodiment. The four straight line portions 8a to 8d are hereinafter referred to as "first straight line portion 8a", "second straight line portion 8b", "third straight line portion 8c", and "fourth straight line portion 8d", respectively. The first straight line portion 8a is substantially parallel to the third straight line portion 8c. The second straight line portion 8b is substantially parallel to the fourth straight line portion 8d. The angle formed by the first straight line portion 8a with each of the second straight line portion 8b and the fourth straight line portion 8d is about 90°. The angle formed by each of the second straight line portion 8b and the fourth straight line portion 8d with the third straight line portion 8c is about 90°.

The outer edge portion 9 comprises four straight line portions 9a to 9d, but the number of the straight line portions 9a to 9d is not limited to this embodiment. The four straight line portions 9a to 9d are hereinafter referred to as "first straight line portion 9a", "second straight line portion 9b", "third straight line portion 9c", and "fourth straight line portion 9d", respectively. The first straight line portion 9a is substantially parallel to the third straight line portion 9c, and is substantially parallel to the first straight line portion 8a of the inner edge portion 8. The second straight line portion 9b is substantially parallel to the fourth straight line portion 9d, and is substantially parallel to the second straight line portion 8b of the inner edge portion 8. The angle formed by the first straight line portion 9a with each of the second straight line portion 9b and the fourth straight line portion 9d is about 90°. The angle formed by each of the second straight line portion 9b and the fourth straight line portion 9d with the third straight line portion 9c is about 90°.

A width W of the bonding surface 2b is set to be constant over the entire circumference thereof. Specifically, the interval between the first straight line portion 8a of the inner edge portion 8 of the bonding surface 2b and the first straight line portion 9a of the outer edge portion 9 thereof is equal to the interval between the second straight line portion 8b of the inner edge portion 8 and the second straight line portion 9b of the outer edge portion 9. Similarly, the interval between the first straight line portion 8a of the inner edge portion 8 of the bonding surface 2b and the first straight line portion 9a of the outer edge portion 9 thereof is also equal to the interval between the third straight line portion 8c of the inner edge portion 8 and the third straight line portion 9c of the outer edge portion 9, and is also equal to the interval between the fourth straight line portion 8d of the inner edge portion 8 and the fourth straight line portion 9d of the outer edge portion 9. The present invention is not limited to this configuration, and those intervals may be different.

As illustrated in FIG. 9, the sealing layer 4 comprises four straight line portions 4a to 4d and four connecting portions 4e to 4h that connect the straight line portions to each other in plan view, but each of the number of the straight line portions 4a to 4d and the number of the connecting portions 4e to 4h is not limited to this embodiment. The four straight line portions 4a to 4d are hereinafter referred to as "first straight line portion 4a", "second straight line portion 4b", "third straight line portion 4c", and "fourth straight line portion 4d", respectively. In addition, the four connecting portions 4e to 4h are referred to as "first connecting portion 4e", "second connecting portion 4f", "third connecting portion 4g", and "fourth connecting portion 4h", respectively.

Each of the straight line portions 4a to 4d has the width W1 that is set to be constant over the entire length thereof. The first straight line portion 4a is formed between the first straight line portion 8a of the inner edge portion 3 and the first straight line portion 9a of the outer edge portion 9 on the bonding surface 2b. The second straight line portion 4b is formed between the second straight line portion 8b of the inner edge portion 8 and the second straight line portion 9b of the outer edge portion 9 on the bonding surface 2b. The third straight line portion 4c is formed between the third straight line portion 8c of the inner edge portion 8 and the third straight line portion 9c of the outer edge portion 9 on the bonding surface 2b. The fourth straight line portion 4d is formed between the fourth straight line portion 8d of the inner edge portion 8 and the fourth straight line portion 9d of the outer edge portion 9 on the bonding surface 2b.

As illustrated in FIG. 9 and FIG. 11, the first connecting portion 4e connects the first straight line portion 4a and the second straight line portion 4b to each other. The second connecting portion 4f connects the second straight line portion 4b and the third straight line portion 4c to each other. The third connecting portion 4g connects the third straight line portion 4c and the fourth straight line portion 4d to each other. The fourth connecting portion 4h connects the fourth straight line portion 4d and the first straight line portion 4a to each other.

In this embodiment, a ratio W1/W of the width W1 of the sealing layer 4 to the width W of the bonding surface 2b is preferably from 0.05 to 1, more preferably from 0.1 to 1, still more preferably from 0.3 to 1, particularly preferably from 0.5 to 1. With this configuration, in the bonding step, cracks ascribed to the thermal shock caused by the rapid cooling of the sealing layer 4 and the glass substrate 3 due to heat conduction from the sealing layer 4 to the highly thermal conductive substrate 2 are less liable to occur. As a result, the sealing layer 4 with which the highly thermal conductive substrate 2 and the glass substrate 3 are hermetically bonded to each other can be formed, and the occurrence of bonding failure can be reduced.

In this embodiment, a ratio A1/A2 of an area A1 (area of a region hatched by the two-dot chain lines in FIG. 11) of the sealing layer 4 that is brought into contact with the bonding surface 2b of the highly thermal conductive substrate 2 to an area A2 (area of a cross-hatched region in FIG. 12) of the bonding surface 2b of the highly thermal conductive substrate 2 is preferably from 0.05 to 1, more preferably from 0.1 to 1, still more preferably from 0.3 to 1, particularly preferably from 0.5 to 1. With this configuration, in the bonding step, cracks ascribed to the thermal shock caused by the rapid cooling of the sealing layer 4 and the glass substrate 3 due to heat conduction from the sealing layer 4 to the highly thermal conductive substrate 2 are less liable to occur. As a result, the sealing layer 4 with which the highly thermal conductive substrate 2 and the glass substrate 3 are hermetically bonded to each other can be formed, and the occurrence of bonding failure can be reduced.

The present invention is not limited to the configurations of the above-mentioned embodiments. In addition, the action and effect of the present invention are not limited to those described above. The present invention may be modified in various forms within the range not departing from the spirit of the present invention.

In each of the above-mentioned embodiments, the method of manufacturing the bonded body 1 that houses one element 5 has been given as an example, but the present invention is not limited to this configuration. For example, the following may be possible. A plurality of recesses 2a are formed on the highly thermal conductive substrate 2, and the glass substrate 3, in which a plurality of sealing materials 6 corresponding to the recesses 2a and each having a closed curve shape are formed, is bonded to the highly thermal conductive substrate 2 under a state in which the element 5 is housed in each of the recesses 2a. In this case, a plurality of hermetic packages can be efficiently manufactured by cutting the bonded body 1 for each element 5.

In each of the above-mentioned embodiments, the bonded body 1 having the element 5 between the highly thermal conductive substrate 2 and the glass substrate 3 has been given as an example, but the present invention is not limited to this configuration. The present invention is applicable also to the case of manufacturing the bonded body 1 having no element 5 between the highly thermal conductive substrate 2 and the glass substrate 3. In each of the above-mentioned embodiments, the highly thermal conductive substrate 2 having the recess 2a formed thereon has been given as an example, but the present invention is not limited to this configuration. The present invention is applicable also to, for example, the case in which a coating film, wiring, via holes, and the like are formed on the surface of the highly thermal conductive substrate 2 on which the recess 2a is not formed, and these sealing objects are sealed.

In each the above-mentioned embodiments, there has been given the example in which the bonding step is performed under the condition that the value of the first output of the laser light in the first heating step is set to be different from the value of the second output of the laser light in the second heating step, but the present invention is not limited to this configuration. For example, the bonding step may be performed under the condition that the scanning speed of the laser light in the first heating step is set to be high and the scanning speed of the laser light in the second heating step is set to be low while the output of the laser light is maintained constant. As a result, the sealing accuracy can be improved in the second heating step while the sealing material is uniformly heated in the first heating step. In addition, the bonding step may be performed under the condition that the spot diameter of the laser light in the second heating step is set to be smaller than the spot diameter of the laser light in the first heating step while the output of the laser light is maintained constant. As a result, the bonding strength can be increased in the second heating step while the sealing material is uniformly heated in the first heating step.

In each of the above-mentioned embodiments, the step (fixing step) of fixing the sealing material 6 to the glass substrate 3 in the preparation step has been given as an example, but the present invention is not limited to this configuration. In the fixing step of the preparation step, the sealing material 6 may be fixed to the highly thermal conductive substrate 2.

In each of the above-mentioned embodiments, there has been given the example in which the inner edge portion 8 and the outer edge portion 9 of the bonding surface 2b of the highly thermal conductive substrate 2 are formed of the straight line portions 8a to 8d and the straight line portions 9a to 9d, respectively, but the present invention is limited to this configuration. The inner edge portion 8 and the outer edge portion 9 may be each partially or entirely formed of curved portions. In this case, when the ratio W1/W of the width W1 of the sealing layer 4 to the width W of the bonding surface 2b is calculated, the width W of the bonding surface 2b in a portion in which the interval between the inner edge portion 8 and the outer edge portion 9 becomes minimum may be used.

EXAMPLES

Now, Examples according to the present invention are described, but the present invention is not limited to these Examples.

The inventor of the present invention evaluated the bonding state and hermetic reliability of each of bonded bodies according to Examples 1 to 5 manufactured through the first heating step (preheating step) in each of the above-mentioned embodiments and a bonded body according to Comparative Example 1 manufactured without being subjected to the preheating step. The details of the evaluation are described below.

A glass substrate used in each of Examples 1 to 5 and Comparative Example 1 is a rectangular glass substrate formed of borosilicate glass. The thickness of the glass substrate according to each of Examples and Comparative Example is 0.2 mm.

A highly thermal conductive substrate used in each of Examples 1 to 5 and Comparative Example 1 is a silicon substrate comprising a recess (cavity) having a quadrangular shape in plan view on one surface. The thickness of the highly thermal conductive substrate according to each of Examples 1 to 5 and Comparative Example 1 is 0.4 mm.

A silicon oxide film having a thickness of 1.0 μm was formed on the surface of the bonding surface of the highly thermal conductive substrate used in Example 2 by a vacuum deposition method.

A sealing material used in each of Examples 1 to 5 and Comparative Example 1 is a composite material (glass frit) containing bismuth-based glass powder and refractory filler powder. The sealing materials used in Examples 1 to 5 and Comparative Example 1 are the same. The composition and characteristics of the sealing material are shown in Table 1.

TABLE 1

| Sealing material | Glass powder | Bismuth-based glass composition (mol %) | | |
|---|---|---|---|---|
| | | | $Bi_2O_3$ | 45 |
| | | | $B_2O_3$ | 25 |
| | | | ZnO | 15 |
| | | | CuO | 10 |
| | | | MnO | 5 |
| | | Bismuth-based glass powder (vol %) | | 75 |
| | Refractory filler powder | β-quartz solid solution powder (vol %) | | 25 |
| | | Average particle diameter $D_{50}$ (μm) | | 1.0 |
| | | 99% particle diameter $D_{99}$ (μm) | | 1.6 |
| | | Softening point (° C.) | | 445 |

The obtained sealing material and a vehicle (formed of ethyl cellulose as a resin and terpineol as a solvent) were mixed at a weight ratio of 60%:40% and kneaded through use of a triple roller to obtain a paste. After that, the glass substrate to which the paste having a quadrangular closed curve shape was applied according to each of Examples 1 to 5 and Comparative Example 1 was obtained by a screen printing method.

After that, the glass substrate having the paste applied thereto according to each of Examples 1 to 5 and Comparative Example 1 was heated in an electric furnace at 480° C. for 20 minutes to form the sealing material having a predetermined quadrangular closed curve shape on the glass substrate.

After that, the glass substrate having the sealing material formed thereon was put on a predetermined position of the highly thermal conductive substrate.

In the bonded body according to each of Examples 1 to 5, the preheating step for the sealing material was performed under the condition that the output of laser light from a near-infrared semiconductor laser having a wavelength of 808 nm was set to 14 W. In the preheating step, the laser light was scanned so as to orbit 100 times along the circumferential direction of the sealing material. The scanning speed of the laser light was 60 mm/sec. After that, the output of the laser light was changed to 25.5 W, and the second heating step (main heating step) for the sealing material was performed without changing the scanning speed. In this main heating step, the laser light was caused to orbit (scanned) twice along the circumferential direction of the sealing material so as to heat the sealing material to form a sealing layer, to thereby bond the highly thermal conductive substrate and the glass substrate to each other.

In Comparative Example 1, the output of laser light was set to 25.5 W, and the scanning speed thereof was set to 60 mm/sec without performing the preheating step. The laser light was caused to orbit twice along the circumferential direction of the sealing material so as to heat the sealing material to form a sealing layer, to thereby bond the highly thermal conductive substrate and the glass substrate to each other.

After that, in order to check the bonding state of each of Examples 1 to 5 and Comparative Example 1, the state of the sealing layer was observed from the glass substrate side with an optical microscope (100 times). A case in which no cracks were able to be observed in the sealing layer and the glass substrate was represented by Symbol "○". A case in which cracks each having a length of less than 1/10 of the width of the sealing layer (hereinafter referred to as "microcracks") were able to be observed was represented by Symbol "Δ". A case in which cracks each having a length equal to or more than 1/10 of the width of the sealing layer were able to be observed was represented by Symbol "x".

Further, the hermetic reliability of the bonded body of each of Examples 1 to 5 and Comparative Example 1 was evaluated by an accelerated deterioration test based on a pressure cooker test (PCT). Specifically, the bonded body manufactured above was retained for 24 hours under an environment of 121° C., 2 atmospheres, and a relative humidity of 100%, and then the vicinity of the sealing layer of the bonded body was observed through use of an optical microscope (100 times). Based on this observation, the presence or absence of cracks in the sealing layer or the glass substrate, the presence or absence of peeling between the sealing layer and the glass substrate, and the presence or absence of alteration of the sealing layer were evaluated. In this evaluation, regarding the presence or absence of cracks, a case in which no cracks were able to be observed was represented by Symbol "○", a case in which microcracks were able to be observed was represented by Symbol "Δ", and a case in which cracks each having a length equal to or more than 1/10 of the width of the sealing layer were able to be observed was represented by Symbol "x". Regarding the presence or absence of peeling, a case in which peeling was observed between the sealing layer and the glass substrate in an optical microscope image was represented by Symbol "x", and a case in which peeling was not observed was represented by Symbol "○".

The conditions and evaluation results of Examples 1 to 5 and Comparative Example 1 are shown in Table 2.

TABLE 2

| | Example 1 | Example 2 | Example 3 | Example 4 | Example 5 | Comparative Example 1 |
|---|---|---|---|---|---|---|
| Preheating | Present | Present | Present | Present | Present | Absent |
| Presence or absence of silicon oxide film or silicon nitride film (thickness: μm) | Absent | Silicon oxide film (1.0 μm) | Absent | Absent | Absent | Absent |
| Sealing width of sealing layer: W1 (mm) | 0.30 | 0.10 | 0.50 | 0.25 | 0.10 | 0.30 |
| Sealing area of sealing layer: A1 (mm$^2$) | 3.00 | 1.00 | 5.00 | 2.50 | 1.00 | 3.00 |
| Width of bonding surface: W (mm) | 0.50 | 0.50 | 1.00 | 2.00 | 2.30 | 0.50 |
| Area of bonding surface: A2 (mm$^2$) | 6.00 | 6.00 | 12.00 | 24.00 | 27.60 | 6.00 |
| Ratio of width: W1/W | 0.60 | 0.20 | 0.50 | 0.13 | 0.04 | 0.60 |
| Ratio of area: A1/A2 | 0.50 | 0.17 | 0.42 | 0.10 | 0.04 | 0.50 |
| State of bonded body — Presence or absence of crack after sealing | ○ | ○ | ○ | ○ | Δ | x |
| State of bonded body — Presence or absence of crack after accelerated deterioration test | ○ | ○ | ○ | ○ | Δ | x |
| State of bonded body — Presence or absence of peeling after accelerated deterioration test | ○ | ○ | ○ | ○ | ○ | x |
| State of bonded body — Presence of absence of alteration of sealing layer after accelerated deterioration test | ○ | ○ | ○ | ○ | ○ | ○ |

As shown in Table 2, in the bonded body according to each of Examples 1 to 4, no cracks occurred in the glass substrate and at the interface between the glass substrate and the sealing layer. In addition, in the bonded body according to Example 5, although microcracks occurred in the glass substrate and at the interface between the glass substrate and the sealing layer, the bonding state was not quite able to be determined to be failure. Meanwhile, in the bonded body according to Comparative Example 1, cracks occurred in the glass substrate superposed on the sealing layer. In addition, a large number of cracks occurred also at the interface between the glass substrate and the sealing layer. As a result, it was recognized that the occurrence of bonding failure between the highly thermal conductive substrate and the glass substrate was able to be reduced by preheating the sealing material.

Figure 13:
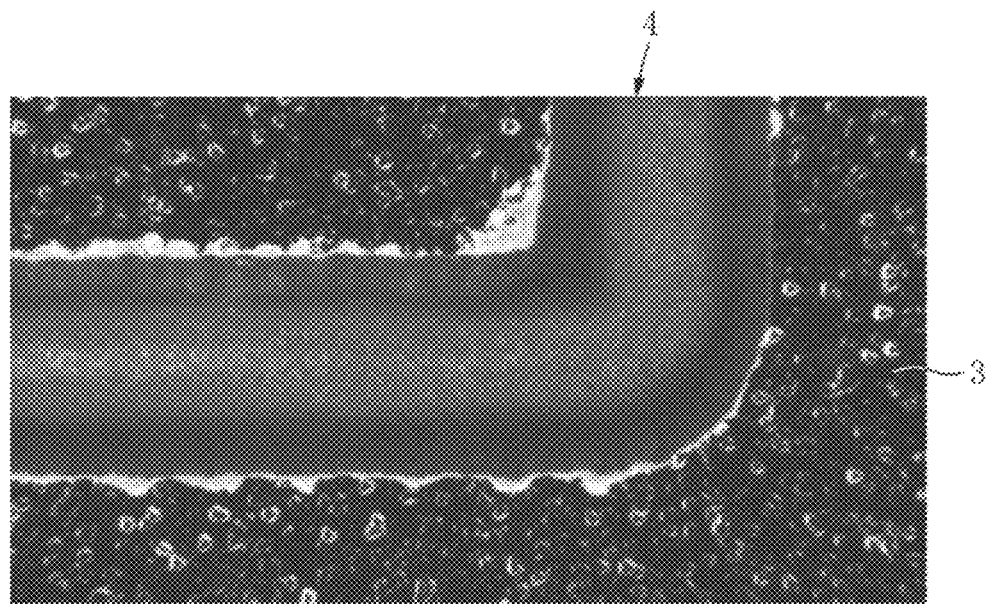
FIG. 13 is an image of a part of a bonded body according to Example.
Figure 14:
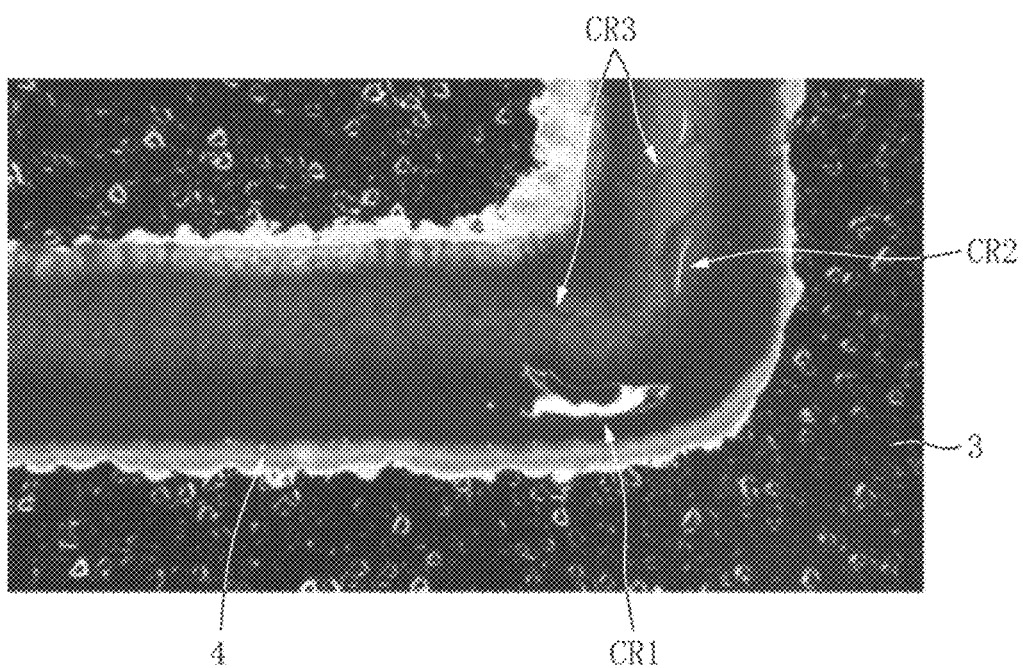
FIG. 14 is an image of a part of a bonded body according to Comparative Example.

An image of the bonded body according to Example 1 is shown in FIG. 13, and an image of the bonded body according to Comparative Example 1 is shown in FIG. 14. As shown in FIG. 14, in the bonded body according to Comparative Example 1, it was recognized that cracks CR1 and CR2 occurred in a part of the glass substrate superposed on the sealing layer. In addition, it was recognized that a large number of cracks CR3 occurred also at the interface between the glass substrate and the sealing layer.

As shown in Table 2, as a result of the accelerated deterioration test, in the bonded body according to each of Examples 1 to 4, no cracks were observed in the sealing layer and the glass substrate, and peeling or the like of the bonded body was not observed. In addition, in the bonded body according to Example 5, although microcracks were observed in the sealing layer and the glass substrate, the bonding state was not quite able to be determined to be failure. Meanwhile, in the bonded body according to Comparative Example 1, extension of cracks was able to be observed in the sealing layer and the glass substrate, and peeling of the bonded body was also observed. It was recognized by this test that the hermetic reliability of the bonded body was obtained by preheating the sealing material. In Examples 1 to 5 and Comparative Example 1, no alteration of the sealing layer was observed (represented by Symbol "○" in Table 2).

REFERENCE SIGNS LIST 1 bonded body
2 highly thermal conductive substrate
2a recess
2b bonding surface
3 glass substrate
4 sealing layer
5 element
6 sealing material
A1 area of sealing layer that is brought into contact with bonding surface
A2 area of bonding surface
L laser light
P1 first output of laser light in first heating step
P2 second output of laser light in second heating step
W1 width of sealing layer
W width of bonding surface

The invention claimed is:

1. A method of manufacturing a bonded body comprising a highly thermal conductive substrate, a glass substrate, and a sealing layer configured to bond the highly thermal conductive substrate and the glass substrate to each other, the method comprising:
   a preparation step of interposing a sealing material containing glass between the highly thermal conductive substrate and the glass substrate; and
   a bonding step of forming the sealing layer by irradiating the sealing material with laser light,
   wherein the bonding step comprises: a first heating step of preheating the sealing material at a temperature lower than a softening point of the sealing material by irradiation with the laser light; and a second heating step of heating, after the first heating step, the sealing material at a temperature equal to or higher than the softening point of the sealing material by irradiation with the laser light.

2. The method of manufacturing a bonded body according to claim 1,
wherein, in the preparation step, the sealing material is formed into a closed curve shape, and
wherein, in the first heating step, the laser light is scanned so as to orbit a plurality of times along a circumferential direction of the sealing material.

3. The method of manufacturing a bonded body according to claim 1, wherein, in the second heating step, the laser light having an output larger than an output of the laser light in the first heating step is radiated to the sealing material.

4. The method of manufacturing a bonded body according to claim 1, wherein the highly thermal conductive substrate is a silicon substrate.

5. The method of manufacturing a bonded body according to claim 1, wherein the laser light is a semiconductor laser.

6. The method of manufacturing a bonded body according to claim 1, wherein the bonded body further comprises an element between the highly thermal conductive substrate and the glass substrate.

7. The method of manufacturing a bonded body according to claim 1, further comprising, before the preparation step, a step of forming a silicon oxide film or a silicon nitride film on a surface of the highly thermal conductive substrate, to thereby interpose the silicon oxide film or the silicon nitride film between the highly thermal conductive substrate and the sealing layer.

* * * * *